United States Patent
Lee et al.

(10) Patent No.: US 7,405,561 B2
(45) Date of Patent: *Jul. 29, 2008

(54) REDUCED POWER SENSING APPARATUS HAVING FLUXGATE AND CONTROL METHOD THEREOF

(75) Inventors: Woo-jong Lee, Suwon (KR); Sang-on Choi, Suwon (KR); Seung-choul Song, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/520,783

(22) Filed: Sep. 14, 2006

(65) Prior Publication Data

US 2007/0063699 A1    Mar. 22, 2007

Related U.S. Application Data

(63) Continuation-in-part of application No. 10/658,380, filed on Sep. 10, 2003, now Pat. No. 7,123,006.

(30) Foreign Application Priority Data

Sep. 18, 2002  (KR) ............... 2002-56712

(51) Int. Cl.
    *G01R 33/04* (2006.01)
(52) U.S. Cl. ..................... 324/253; 324/247
(58) Field of Classification Search ............. 324/253, 324/247; 33/355 R, 356
    See application file for complete search history.

(56) References Cited

U.S. PATENT DOCUMENTS

| 4,622,843 | A | 11/1986 | Hormel |
| 5,223,821 | A | 6/1993 | Poe et al. |
| 5,333,110 | A | 7/1994 | Al-Attar |
| 5,376,245 | A | 12/1994 | McLeod |
| 5,744,956 | A | 4/1998 | Hawks |
| 5,764,052 | A | 6/1998 | Renger |
| 6,282,803 | B1 | 9/2001 | Dunne |
| 7,123,006 | B2 * | 10/2006 | Lee et al. ............ 324/253 |
| 2005/0183274 | A1 * | 8/2005 | Cho et al. ............ 33/356 |
| 2007/0057670 | A1 * | 3/2007 | Kobayashi et al. ...... 324/253 |

FOREIGN PATENT DOCUMENTS

| JP | 03-206915 | 9/1991 |
| JP | 08-106338 | 4/1996 |
| JP | 2001-050749 | 2/2001 |
| KR | 20040106086 A * | 12/2004 |

* cited by examiner

*Primary Examiner*—Patrick Assouad
*Assistant Examiner*—David M. Schindler
(74) *Attorney, Agent, or Firm*—Lee & Morse, P.C.

(57) ABSTRACT

A sensing apparatus includes a fluxgate module which outputs an analog signal corresponding to terrestrial magnetism using a fluxgate having a magnetic substance core and a driving coil, and an analog-to-digital (A/D) converter which converts an analog signal output from the fluxgate module into a digital signal. The fluxgate module includes first and second current amplifiers for exciting the magnetic substance core by applying pulses to first and second ends of the driving coil, and a pulse restricting part for driving the first and second current amplifiers to apply the pulses and for stopping driving the first and second current amplifiers when converting the analog signal into the digital signal is completed.

14 Claims, 11 Drawing Sheets

REDUCED POWER SENSING APPARATUS HAVING FLUXGATE AND CONTROL METHOD THEREOF

CROSS-REFERENCE TO RELATED APPLICATIONS

The present application is a continuation-in-part application of commonly assigned, U.S. application Ser. No. 10/658,380, filed Sep. 10, 2003 now U.S. Pat. No. 7,123,006, and entitled: "SENSING APPARATUS HAVING FLUXGATE AND CONTROL METHOD THEREOF," the entire contents of which is hereby incorporated by reference.

BACKGROUND OF THE INVENTION

1. Field of the Invention

The present invention relates to a fluxgate. More particularly, the present invention relates to a sensing apparatus having a high-efficiency fluxgate and a control method thereof capable of reducing power consumption by minimizing driving current.

2. Background of the Related Art

A fluxgate is a sensor detecting a terrestrial magnetism. The fluxgate uses a high permeability material such as permalloy as a magnetic substance core for a driving coil to apply an excited magnetic field thereto. The fluxgate also uses magnetic saturation and nonlinear magnetic characteristics of the core to measure a second harmonic component proportionate to an external magnetic field, thereby measuring the strength of the external magnetic field.

FIG. 1 is a circuit diagram of the configuration of a fluxgate module having a fluxgate to detect a signal corresponding to terrestrial magnetism. As shown in FIG. 1, the fluxgate includes a driving coil 40 for applying current to excite a magnetic substance core with current, a pulse generator 10 for generating pulses to be applied to the driving coil 40, amplifiers 30 and 31 for amplifying pulses to be applied to a first end a and a second end b, of the driving coil 40, and an inverter 20 for inverting the pulse applied to the second end b of the driving coil 40 to generate current.

Signals for turning the current amplifiers 30 and 31 on and off are due to a pulse P1 generated from the pulse generator 10. The pulse P1 from the pulse generator 10 is directly transmitted to the current amplifier 30, and is inverted through the inverter 20 to have a reversed phase when transmitted to the current amplifier 31.

Thus, pulse signals P2 and P3 applied to the first and second ends a and b, respectively, of the driving coil 40, which are respectively connected to the amplifiers 30 and 31, have opposite phases. When, at q1 of FIG. 1, the pulse signal P2 has a high level at the first end a and the pulse signal P3 has a low level at the second end b, current flows from a to b along the coil 40. On the other hand, when, at q2 of FIG. 2, the pulse signal P2 has a low level at the first end a, and the pulse signal P3 has a high level at the other end b, current flows from b to a along the coil 40. As a result, current is applied to the driving coil 40 in response to the pulse signals, thereby exciting the magnetic substance core on which the driving coil 40 is wound.

To drive the fluxgate, the pulse generator 10 is driven to apply a pulse train to the driving coil 40. Thus, when the fluxgate is driven with the driving coil 40 being driven by the generated pulse train, current flows constantly causing a high current consumption in a unit time interval.

MEMS (Micro-Electro Mechanical System) is a technology implementing mechanical and electrical parts using a semiconductor manufacturing process. A fluxgate may be minimized and integrated using MEMS technology. A fluxgate manufactured by a MEMS manufacturing process for a potable small-size terminal is generally used when there is a limited power source. Therefore, characteristic high current consumption of a fluxgate in a unit time interval can be a significant problem.

Meanwhile, the signal detected from the fluxgate goes through chopping, amplification and filtering to be input to an analog-to-digital (A/D) converter. In this case, if there are a plurality of the fluxgates, a plurality of circuits for the chopping, amplification and filtering are needed. Therefore, in the case of a fluxgate sensing apparatus to detect 2-axis magnetism, space occupied by circuits for signal processing is large. Thus, the fluxgate sensing apparatus is not compact.

SUMMARY OF THE INVENTION

In an effort to solve at least the problems and/or disadvantages described above, it is a feature of an embodiment of the present invention to provide a sensing apparatus having a fluxgate and a control method thereof capable of reducing power consumption to drive the fluxgate.

In an effort to solve at least the problems and/or disadvantages described above, it is another feature of an embodiment of the present invention to provide a sensing apparatus having a 2-axis fluxgate and a control method thereof capable of being miniaturized by reducing the number of components for processing signals detected from the fluxgate.

In an effort to provide the foregoing and other features and advantages, a sensing apparatus having a fluxgate is provided, including a fluxgate module which outputs an analog signal corresponding to terrestrial magnetism using a fluxgate having a magnetic substance core and a driving coil, and an analog-to-digital (A/D) converter which converts an analog signal output from the fluxgate module into a digital signal, wherein the fluxgate module including first and second current amplifiers which excite the magnetic substance core by applying pulses to first and second ends of the driving coil, and a pulse restricting part which drives the first and second current amplifiers to apply the pulses and which stops driving the first and second current amplifiers if converting the analog signal into the digital signal is completed.

The pulse restricting part may include a pulse generator which generates a pulse, a pulse controller which outputs a control pulse to control the operation of the fluxgate, and a logic gate which logically operates the pulse and the control pulse and which inputs a pulse signal according to the results of the logical operation to the first and second current amplifiers.

The pulse controller may output a control pulse of a high value, and output a control pulse of a low value if converting the analog signal into the digital signal in the A/D converter is completed, and the logic gate may logically multiply the pulse and the control pulse, and input a signal according to the results of the logical multiply to the first and second current amplifiers.

The fluxgate module may further include an inverter which inverts a signal output from the pulse restricting part to output the signal to the second current amplifier, and the second current amplifier amplifies the inverted signal to output an inversion pulse.

The fluxgate may be a 2-axis fluxgate of which axes cross at right angles.

The fluxgate module may further include an input switching part which selectively transmits the pulse and inversion pulse output from the first and second current amplifiers to the driving coils of the 2-axis fluxgate; and an output switching part which selectively transmits a detected signal from the 2-axis fluxgate to the next step.

The fluxgate module may further include a chopping circuit part which chops the signal transmitted from the output switching part, a first amplifier which amplifies the chopped signal, a filter which filters the amplified signal, and a second amplifier which amplifies the filtered signal and provides the signal to the A/D converter.

The pulse controller may output a control pulse of a high value until the signal output from the second amplifier reaches its full rising value, and the pulse controller may output a control pulse of a low value after a preset time passes.

Meanwhile, a method of controlling a sensing apparatus which includes a fluxgate including a magnetic substance core and a driving coil, first and second current amplifiers which excite the magnetic substance core by applying pulses to first and second ends of the driving coil, a fluxgate module including a pulse restricting part which controls the operation of the first and second current amplifiers, and an analog-to-digital (A/D) converter which converts an analog signal output from the fluxgate module into a digital signal, the method including outputting a first control signal in order for the pulse restricting part to drive the first and second current amplifiers, and exciting the fluxgate so that a detected signal corresponding to terrestrial magnetism is acquitted, AND converting the detected signal, and outputting a second control signal to stop the operation of the first and second current amplifiers and ending the operation of the fluxgate module, if the A/D converting is completed.

The pulse restricting part may include a pulse generator which generates a pulse, a pulse controller which outputs a control pulse to control the operation of the fluxgate, and a logic gate which logically operates the pulse and the control pulse and which inputs a pulse signal according to the results of the logical operation to the first and second current amplifiers.

The pulse controller may output a control pulse of a high value, and output a control pulse of a low value if conversion in the A/D converter is completed, and the logic gate logically may multiply the pulse and the control pulse, and input one of the first and second control signals according to the results of the logical multiply to the first and second current amplifiers.

The fluxgate module may further include an inverter which inverts the signal output from the pulse restricting part to output the signal to the second current amplifier, and the second current amplifier amplifies the inverted signal to output an inversion pulse.

The fluxgate may be a 2-axis fluxgate of which axes cross at right angles.

The fluxgate module may further include an input switching part which selectively transmits the pulse and inversion pulse output from the first and second current amplifiers to the driving coils of the 2-axis fluxgate, and an output switching part which selectively transmits a signal detected from the 2-axis fluxgate to the next step.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Korean Patent Application No. 2002-56712, filed on Sep. 18, 2002, and entitled: "Sensing Apparatus Having Fluxgate And Control Method Thereof," is incorporated by reference herein in its entirety.

Hereinafter, exemplary embodiments of the present invention will be described in detail with reference to the accompanying drawing figures.

Figure 1:
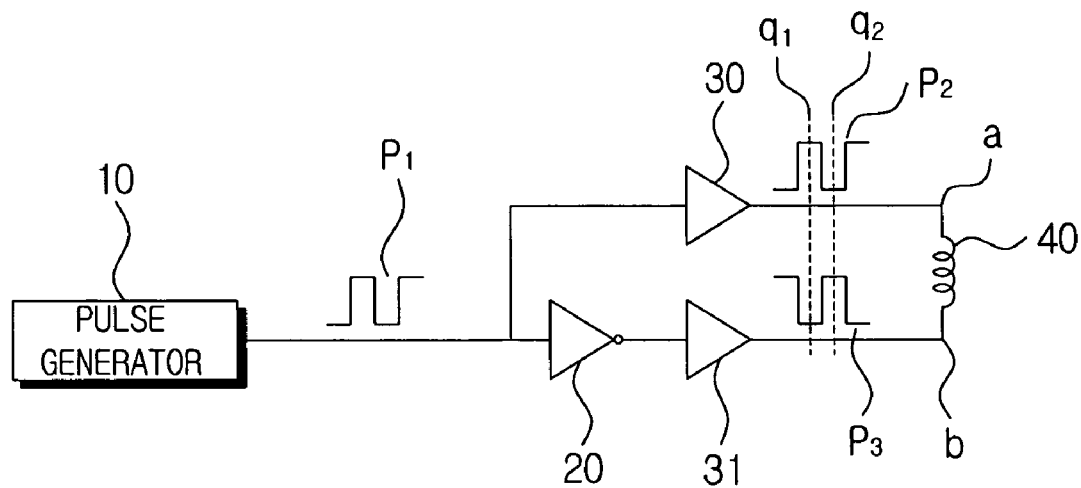
FIG. 1 is a circuit diagram of a conventional fluxgate module.
Figure 2:
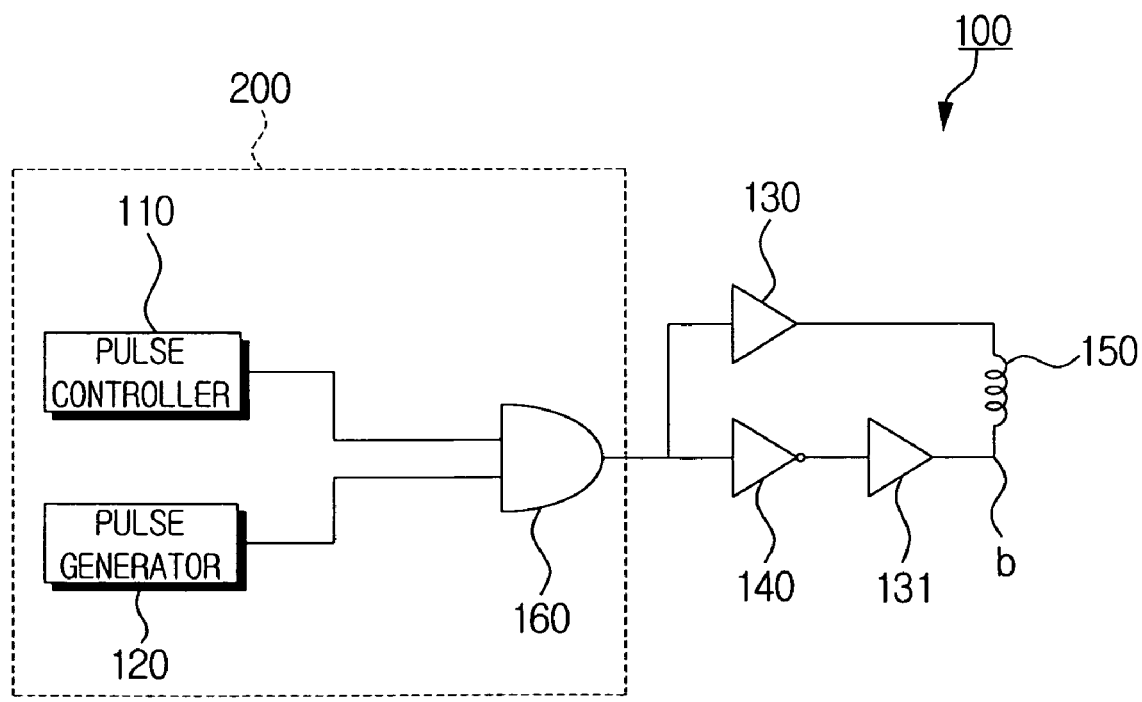
FIG. 2 is a circuit diagram of a fluxgate module according to an embodiment of the present invention.
Figure 3:
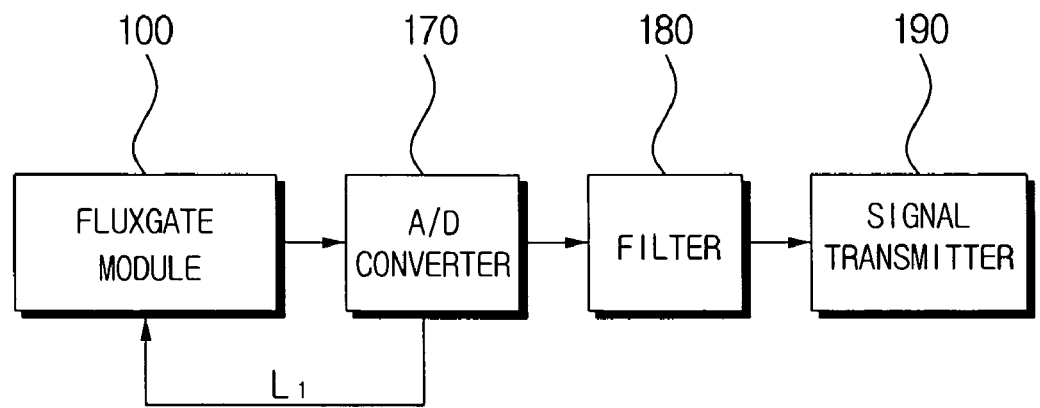
FIG. 3 is a block diagram schematically showing a sensing apparatus having the fluxgate module of FIG. 2.

FIG. 2 is a circuit diagram of a fluxgate module according to an embodiment of the present invention, and FIG. 3 is a block diagram schematically showing a sensing apparatus having the fluxgate module of FIG. 2. Referring to FIGS. 2 and 3, the sensing apparatus includes a fluxgate module 100, an analog-to-digital (A/D) converter 170, a filter 180 and a signal transmitter 190.

The fluxgate module 100 includes a fluxgate (not shown in its entirety) including a driving coil 150, first and second current amplifiers 130 and 131, an inverter 140 and a pulse restricting part 200. The fluxgate includes a magnetic substance core (not shown), a driving coil 150 and a sensor coil (not shown). The driving coil 150 is wound on a magnetic substance core to excite the magnetic substance core, on which the sensor coil is also wound. The first and second current amplifiers 130 and 131 are connected to first and second ends a and b, respectively, of the driving coil 150 to apply current to the driving coil 150. The inverter 140 is connected to the second current amplifier 131 to invert an input signal and to transmit the inverted signal to the second current amplifier 131.

The pulse restricting part 200 selectively restricts pulses which are applied to the first and second current amplifiers 130 and 131 in order to control the operation of the first and second current amplifiers 130 and 131. The pulse restricting part 200 includes a pulse controller 110, a pulse generator 120 and an AND gate 160.

The pulse generator 120 generates a pulse P1 to turn on/off the first and second current amplifiers 130 and 131, and applies the pulse P1 to the first and second current amplifiers 130 and 131. As shown in FIG. 2, the pulse P1 is directly input to the first current amplifier 130, and thus current P2 having a same phase as that of the pulse P1 is applied to the first end a of the driving coil 150. The pulse P1 is inverted by the inverter 140 and input to the second current amplifier 131. Thus, current P3, having an opposite phase to that of the pulse P1, is applied to the second end b of the driving coil 150. Since P2 and P3 are opposite in phase, when, at $q_1$, a high level signal is input to the first end a of the driving coil 150 and a low level signal is input to the second end b of the driving coil 150, current flows from a to b. When, at $q_2$, a low level signal is input to the first end a and a high level signal is input to the second end b, current flows from b to a. Since high/low level signals are input in turn with respect to pulses, current is applied to the driving coil 150 to excite the magnetic substance core on which the driving coil 150 is wound.

With the above configuration, the fluxgate module 100 senses a magnetic field when the magnetic substance core is sufficiently excited as current flows along the driving coil 150, and then the sensor coil (not shown) outputs an analog sensor signal. The fluxgate module 100 further includes an additional analog signal processing circuit (not shown) for processing the output analog sensor signal from the sensor coil. The processed analog sensor signal is converted into a digital signal to be transmitted to other systems by using the analog sensor signal.

Referring to FIG. 3, the analog sensor signal output from the fluxgate module 100 is input to the AND converter 170 to be converted into the digital signal. The A/D converter 170 is connected to the pulse controller 110 of the fluxgate module 100 as shown by $L_1$, in order for the pulse controller 110 to detect when conversion of the analog sensor signal into the digital signal is completed. The filter 180 is connected to the A/D converter 170 to filter the digital signal. The signal transmitter 190 is connected to the filter 180 to transmit the filtered signal to the other systems using the sensor signal from the fluxgate module 100. The sensor signal from the fluxgate module 100 is interfaced through the signal transmitter 190.

With the above configuration, the fluxgate module 100 of the sensing apparatus applies current to the driving coil 150 only while the sensor signal is A/D converted by the A/D converter 170 during one driving cycle of the sensing apparatus. To this end, the pulse to turn on/off the first and second current amplifiers 130 and 131 that apply current to the first and second ends of the driving coil 150 is input to the first and second current amplifiers 130 and 131 only during the A/D conversion.

Figure 4:
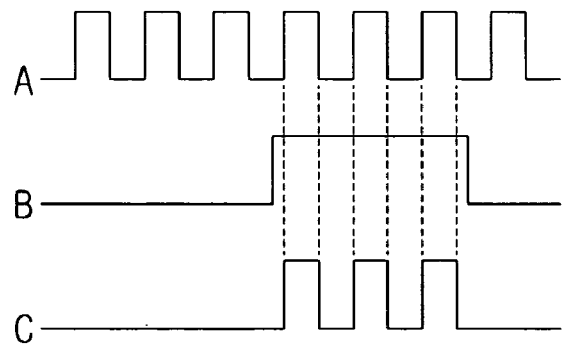
FIG. 4 illustrates waveforms of control signals applied to the fluxgate module of FIG. 2 and a pulse controller.
Figure 4:
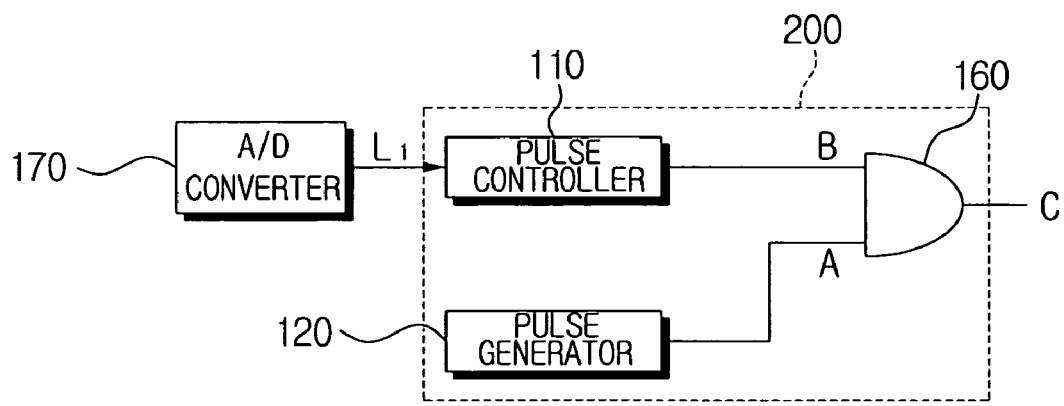

A detailed description of a control signal for pulse control according to an embodiment of the present invention will be presented hereinafter with reference to FIG. 4. FIG. 4 shows waveforms of signals for pulse control and a block diagram including the pulse restricting part 200. As shown in FIG. 4, a pulse A generated from the pulse generator 120 and a control signal B output from the pulse controller 110 are input to the AND gate 160. The AND gate 160 logical ANDs the control signal B and the pulse A to output a signal C to the first and second current amplifiers 130 and 131.

When the fluxgate module 100 initiates a drive, the pulse controller 110 inputs a driving signal to the pulse generator 120 to generate a pulse A, and begins to input a high level signal as a control signal B to the AND gate 160. The pulse A generated from the pulse generator 120 and the control signal B from the pulse controller 110 are logical AND-ed to output a signal C only while the control signal B is a high level signal.

The pulse controller 110 is connected to the A/D converter 170, shown by $L_1$, to determine whether the A/D conversion is completed in response to an input signal from the A/D converter 170. When the pulse controller 110 determines that the A/D conversion is completed, the control signal B is converted to a low level signal and is applied to the AND gate 160. Upon inputting the low level signal to the AND gate 160, the AND gate 160 does not output a pulse, so that the first and second current amplifiers 130 and 131 are turned off, and current is not applied to the driving coil 150.

Figure 5:
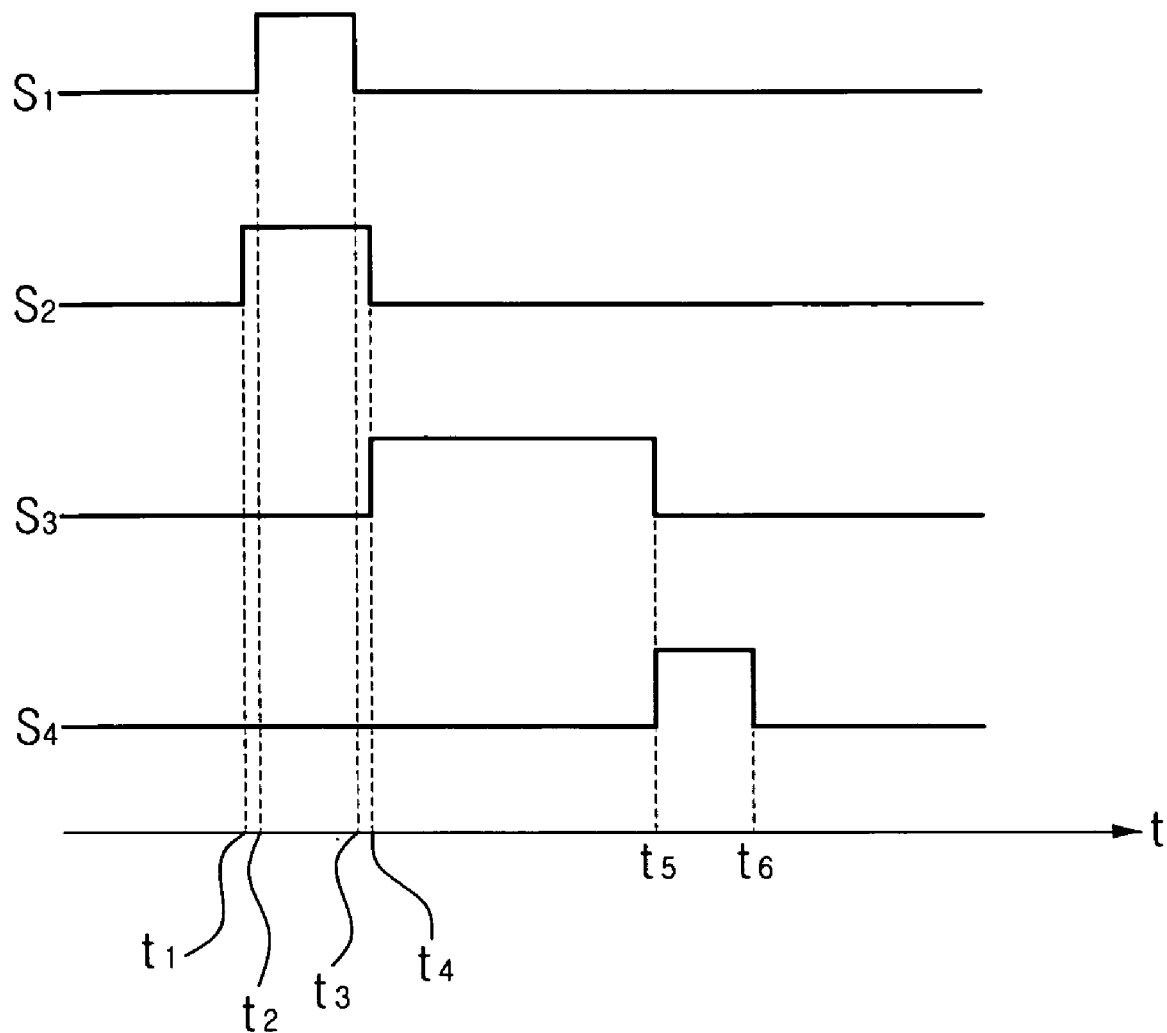
FIG. 5 is a waveform diagram illustrating an operation of the sensing apparatus of FIG. 3.

Operation of the sensing apparatus for controlling pulses according to an embodiment of the present invention will be described hereinafter with reference to FIGS. 5 and 6. FIG. 5 illustrates waveforms of one cycle of the sensing apparatus, wherein $S_1$ represents an 'Enable' signal of the A/D converter 170, $S_2$ represents a control signal, such as control signal B, of the pulse controller 110, $S_3$ represents a filtered 'Enable' signal filtered by the filter 180 and $S_4$ represents a signal transmission 'Enable' signal output from the signal transmitter 190 after being processed, all with respect to a time axis t.

Figure 6:
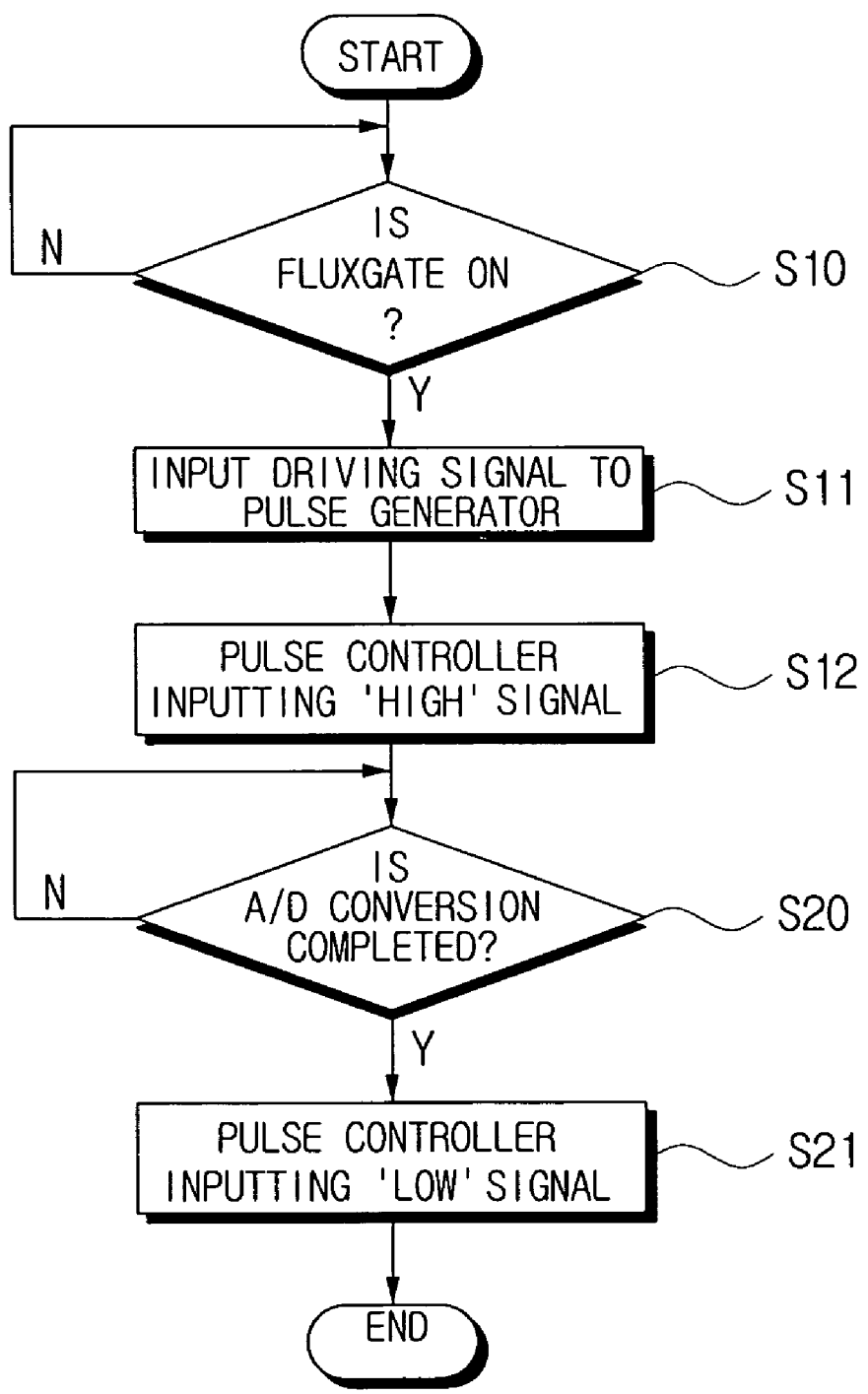
FIG. 6 is a flow chart illustrating a control method of a sensing apparatus according to an embodiment of the present invention.

FIG. 6 shows a flow chart of a control method of the present invention. With respect to FIGS. 3-6, upon deciding that the fluxgate module 100 initiates the operation (S10), the pulse controller 110 inputs a driving signal to the pulse generator 120 to generate a pulse (S11), and inputs a high level signal, such as $S_2$, as a control signal B to the AND gate 160 (S12). During the inputting of the high level signal as the control signal B, the AND gate 160 outputs a pulse to the first and second current amplifiers 130 and 131. During the inputting of the pulse to the first and second current amplifiers 130 and 131, the driving coil 150 drives, and thus the fluxgate outputs an analog sensor signal. The analog sensor signal is input to the A/D converter 170 to be converted into a digital signal. That is, the control signal $S_2$ is input to the AND gate 160 at a high level at $t_1$, and the enable signal $S_1$ is output from the fluxgate module 100 and input to the A/D converter 170, where the A/D converter 170 is enabled to convert analog into digital signal, at $t_2$.

When the A/D conversion is completed at $t_3$ (S20), the pulse controller 110 detects the completion, and inputs the control signal $S_2$ at a low level to the AND gate 160 at $t_4$ (S21). The converted digital signal $S_3$ is input to the filter 180 to be filtered at $t_4$. When the filtering is completed, the filtered signal $S_4$ is input to the signal transmitter 190 at $t_5$ to be transmitted to external systems.

With the present control method, current for driving the driving coil of the fluxgate during one cycle begins flowing when the fluxgate module 100 initiates the operation, and continues to flow until it is decided that conversion of the sensor signal from the fluxgate module 100 by the A/D converter 170 is completed.

Namely, when the A/D conversion of the sensor signal from the fluxgate module 100 is completed by the A/D converter 170, the control signal B from the pulse controller 110 is converted to a low level signal. Since the control signal B being input to the AND gate 160 is now a low level signal, the pulse is blocked from being input to the first and second current amplifiers 130 and 131, and current is not applied to the driving coil 150. Therefore, an amount of current applied to drive the fluxgate is reduced.

An example of a reduction in the current necessary to drive the fluxgate that is possible by the present invention is as follows: if one cycle of the sensing apparatus is 5 ms long, an actual driving time of the coil is reduced to about 20 µs. In such a case, if power consumption of the conventional fluxgate is 100 when current is continuously applied to the driving coil during one cycle, the power consumption of the fluxgate according to the present invention is reduced to 0.4 of the power consumption of the conventional fluxgate, i.e., 40.

Figure 7:
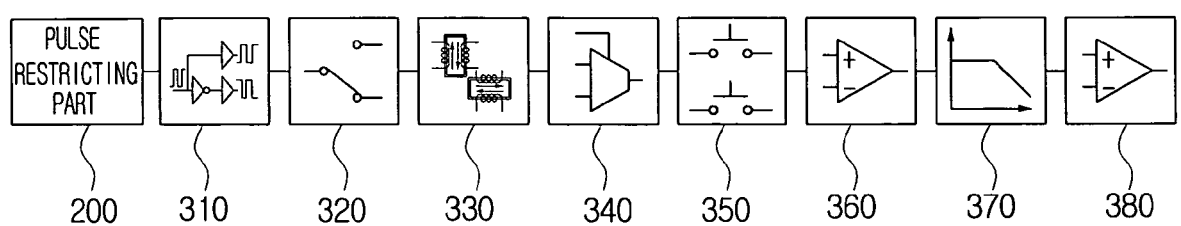
FIG. 7 is a block diagram schematically of a fluxgate module according to another embodiment of the present invention.

FIG. 7 is a block diagram schematically of a fluxgate module having a 2-axis fluxgate according to another embodiment of the present invention. The fluxgate module includes a pulse restricting part 200, a pulse amplifier 310, an input switching part 320, a fluxgate 330, an output switching part 340, a chopping circuit part 350, a first amplifier 360, a filter 370 and a second amplifier 380.

Figure 8:
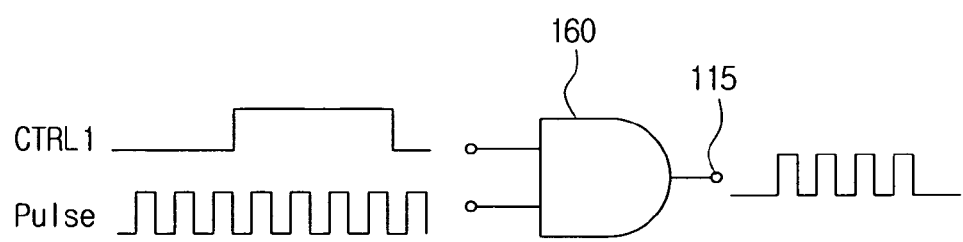
FIG. 8 is a circuit diagram schematically of a pulse restricting part and waveforms of signals.

The pulse restricting part 200 restrictively outputs pulses to control the operation of the pulse amplifier 310. The configuration of the pulse restricting part 200 is shown in FIGS. 2 and 8. That is, the pulse restricting part 200 includes the pulse controller 110, the pulse generator 120 and the AND gate 160. Referring to FIG. 8, a pulse generated from the pulse generator 120 and a control pulse signal ctrl1 generated from the pulse controller 110 are input to first and second ends of the AND gate 160. Thus, the AND gate 160 outputs a control signal of a pulse form.

Figure 9:
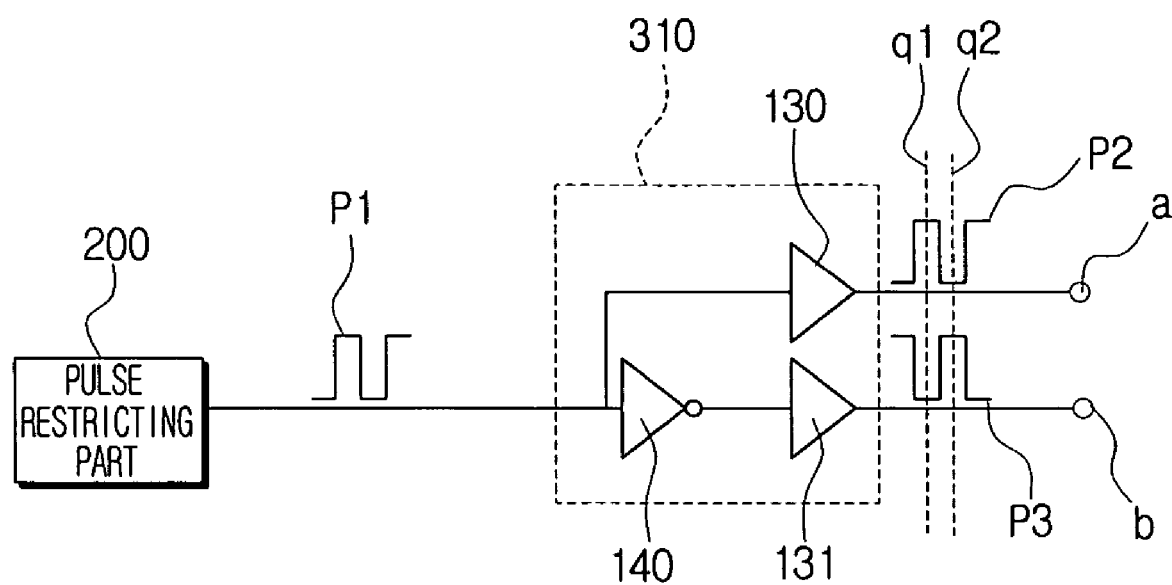
FIG. 9 is a circuit diagram schematically of a pulse amplifier and waveforms of signals.

The control signal output from the pulse restricting part 200 drives the pulse amplifier 310 to output a pulse and an inversion pulse. That is, the pulse amplifier 310 outputs two pulse signals having opposite phases. As shown in FIG. 9, the pulse amplifier 310 includes the inverter 140, and first and second current amplifiers 130 and 131, as in FIG. 2.

Referring to FIG. 9, a control signal P1 applied to the pulse amplifier 310 is input commonly to the first and second current amplifiers 130 and 131. The pulse input to the first current amplifier 130 is amplified by the first current amplifier 130 and is output as a pulse signal P2. The pulse P1 input to the second current amplifier 131 is inverted by the inverter 140, amplified by the second current amplifier 131 and output as an inverse pulse P3.

Figure 10:
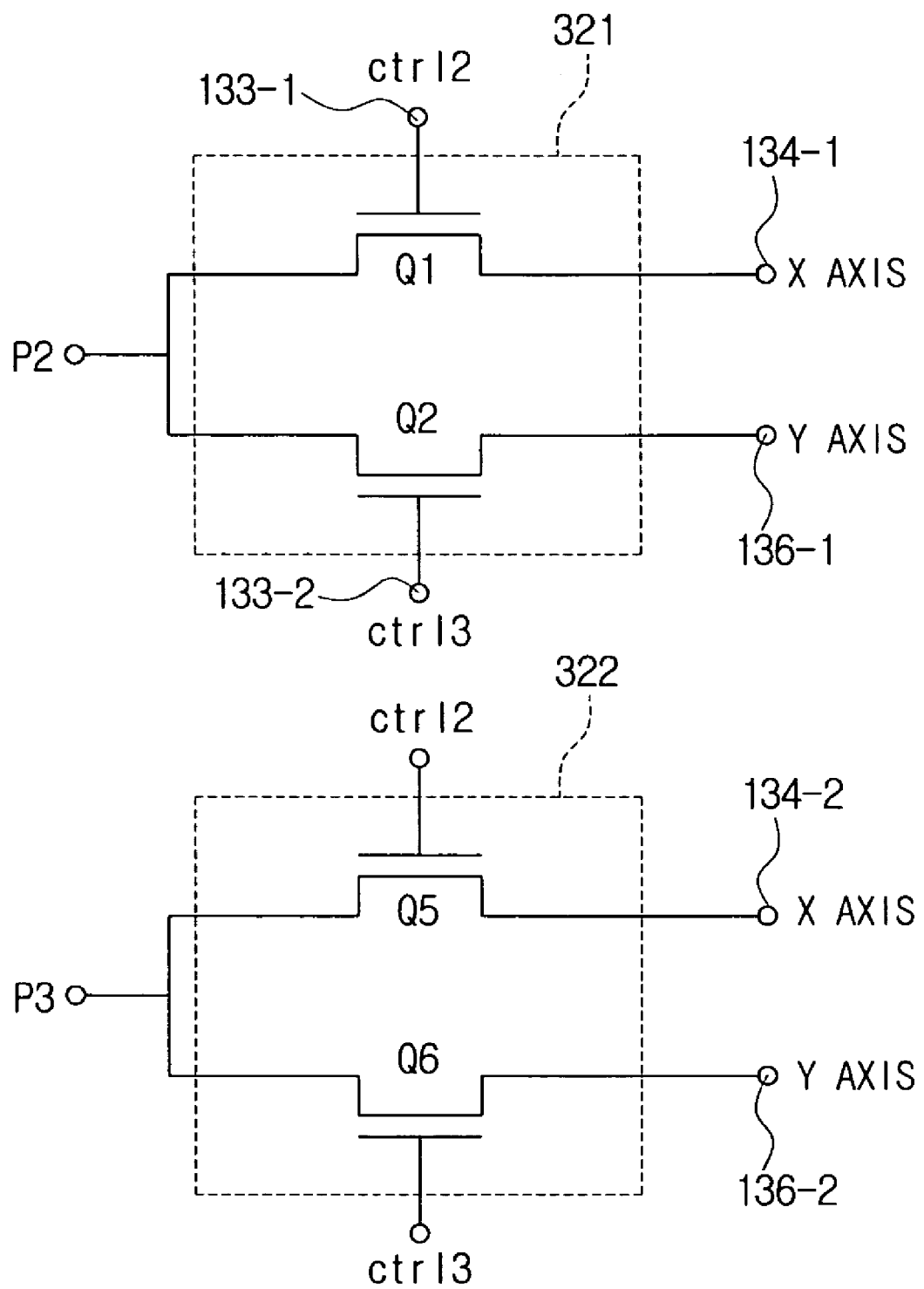
FIG. 10 is a circuit diagram of an input switching part.

FIG. 10 is a circuit diagram showing the input switching part 320 in detail. The input switching part 320 selectively transmits the amplified signal and inverse amplified signal, which are output from the pulse amplifier 310, to each driving coil respectively of the 2-axis fluxgate.

The input switching part 320 includes a first input switching part 321 which transmits the pulse P2 output from the pulse amplifier 310 to a first end of each driving coil of the 2-axis fluxgate, and a second input switching part 322 which transmits the inverse pulse P3 to a second end of each driving coil of the 2-axis fluxgate.

The first input switching part 321 includes a first transistor Q1 which transmits the pulse signal P2 to a first end 134-1 of a driving coil of an X-axis fluxgate in response to a second control signal ctrl2, and a second transistor Q2 which transmits the pulse signal P2 to a first end 136-1 of a driving coil of an Y-axis fluxgate in response to a third control signal ctrl3.

The second input switching part 322 includes fifth and sixth transistors Q5 and Q6 which transmits the pulse signal P3 to second ends 134-2 and 136-2 of driving coils of X-axis and Y-axis fluxgates respectively in response to the second and third control signals.

Referring to FIGS. 9 and 10, the process of exciting the fluxgate 330 is described. If the first, second, fifth and sixth transistor Q1, Q2, Q5 and Q6 are turned on by the second and third control signals, the pulses and inverse pulses are input to the first and second ends of the X-axis and Y-axis driving coils. The pulses and inverse pulses output from the pulse amplifier 310 have opposite phases at the same point of time. That is, as shown in FIG. 9, node a has a higher phase than node b at q1, and node b has a higher phase than node a at q2. Accordingly, the direction of current alternately changes due to the phase difference between the first and second ends of the driving coils, thereby exciting magnetic substance cores 142 and 146 on which each driving coil is wound, as described below in connection with FIG. 11.

As described above, with the single pulse amplifier 310, all the 2-axis fluxgate can be excited by the input switching part 320.

Figure 11:
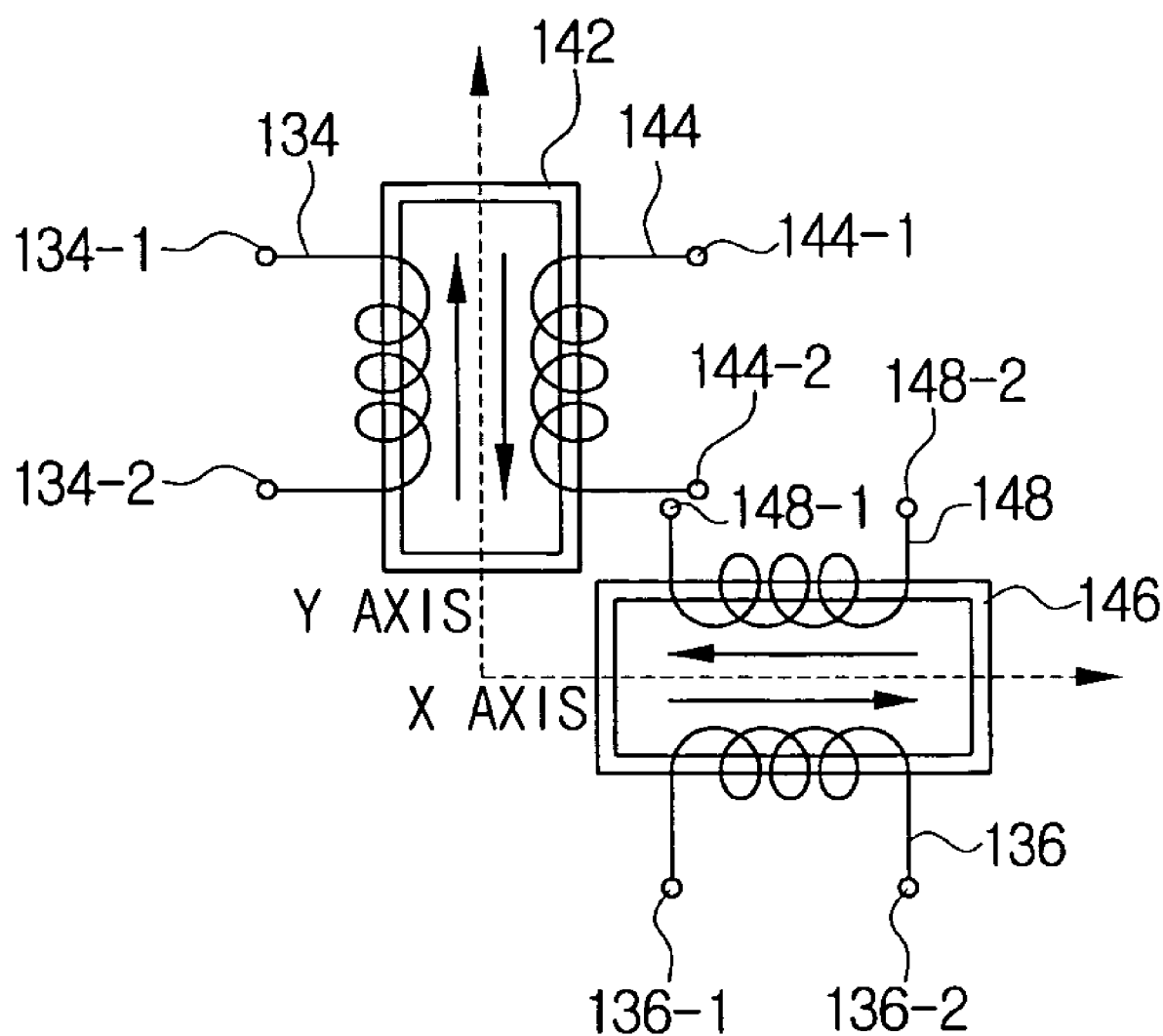
FIG. 11 is a circuit diagram of a fluxgate.

The fluxgate 330 is driven by a pulse amplification signal and a pulse inversion amplification signal which are transmitted selectively to x-axis or Y-axis by the input switching part 320, and outputs a detected signal. FIG. 11 is a circuit diagram specifically showing the 2-axis fluxgate 330. In the 2-axis fluxgate 330, two magnetic substance cores 142 and 146 of the square ring shape respectively are disposed lengthwise in the direction of X-axis and Y-axis. The magnetic substance cores 142 and 146 respectively are wound with each of driving coils 134 and 136 and each of detecting coils 144 and 148. The driving coils 136 and 134 respectively excite the X-axis and Y-axis magnetic substance cores 146 and 142, the excited fluxgates are induced by the neighboring magnetic field to generate electromotive force, and the detecting coils 144 and 148 output detected signals corresponding to the electromotive force. The detected signals are analog signals corresponding to the strength of terrestrial magnetism.

Figure 12:
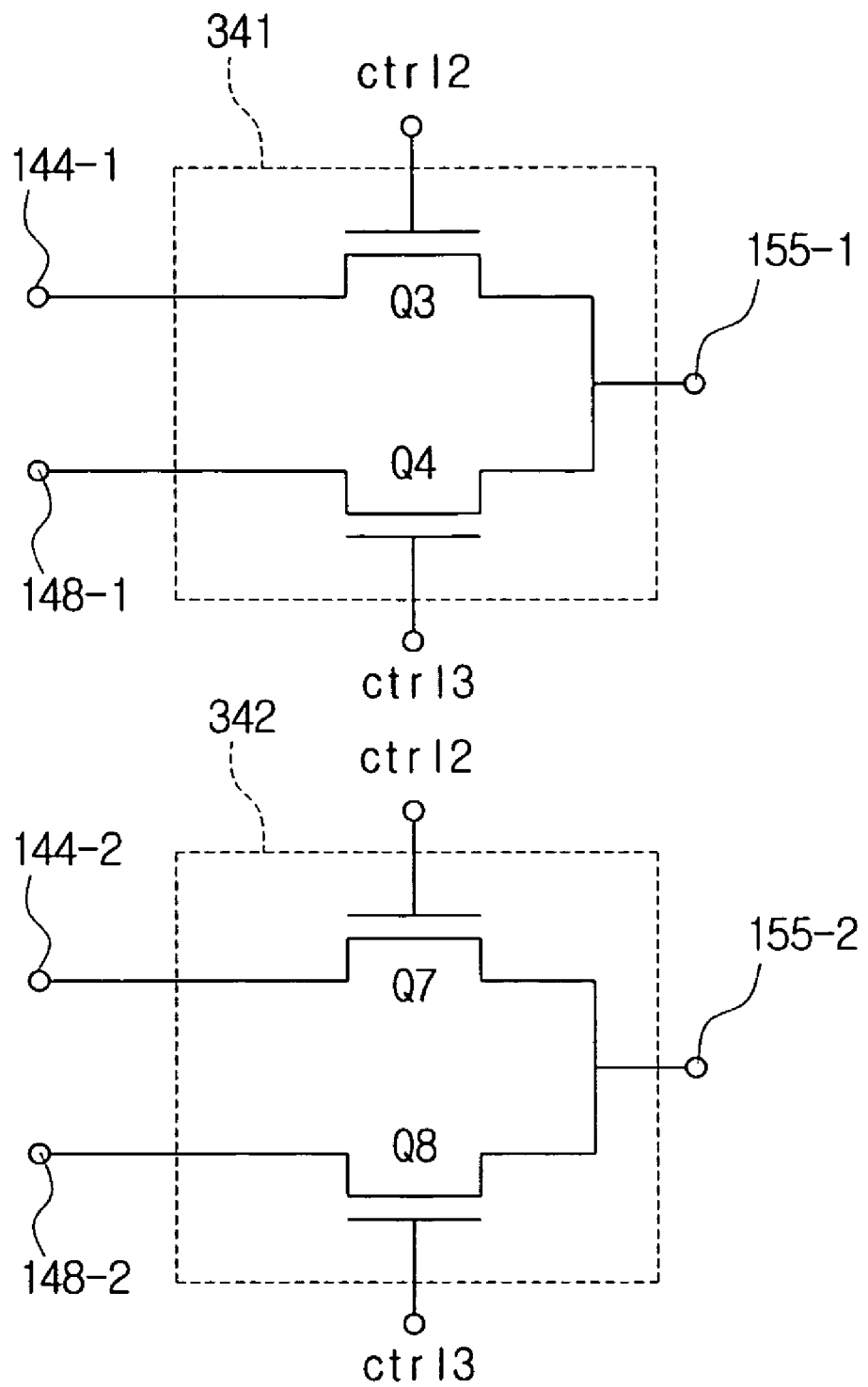
FIG. 12 is a circuit diagram of an output switching part.

The output switching part 340 is connected to the detecting coils 148 and 144, which are respectively wound with each of X-axis and Y-axis fluxgate, to output a detected signal of the driving axis. FIG. 12 is a circuit diagram of the output switching part 340. The output switching part 340 includes a first output switching part 341 and a second output switching part 342.

The first output switching part 341 includes a third transistor Q3 which selectively connects a first end 144-1 of the Y-axis detecting coil 144 and a first end 155-1 of the chopping circuit part 350 in response to a second control signal ctrl2, and a fourth transistor Q4 which selectively connects a first end 148-1 of the X-axis detecting coil 148 and the first end 155-1 of the chopping circuit part 350 in response to a third control signal ctrl3.

The second output switching part 342 includes a seventh transistor Q7 which selectively connects a second end 144-2 of the Y-axis detecting coil 144 and a second end 155-2 of the chopping circuit part 350 in response to the second control signal ctrl2, and a eighth transistor Q8 which selectively connects a second end 148-2 of the X-axis detecting coil 148 and the second end 155-2 of the chopping circuit part 350 in response to the third control signal ctrl3.

As a result, the output switching part 340 can selectively transmit a signal detected from the fluxgate to the chopping circuit part 350.

Figure 13:
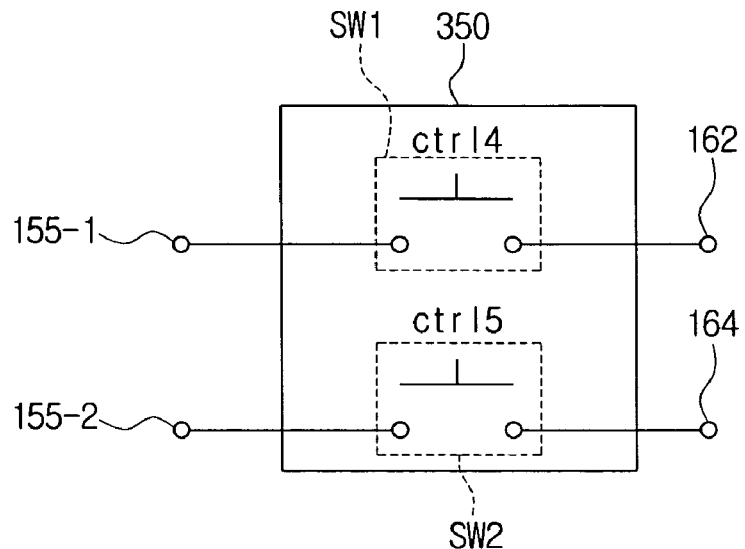
FIG. 13 is a circuit diagram of an chopping circuit part.

The chopping circuit part 350 chops the detected signal of one axis output from the output switching part 340. FIG. 13 is a circuit diagram of the chopping circuit part 350. The chopping circuit part 350 includes first and second switches SW1 and SW2 which chop the detected signals output from the output switching part 340 in response to the fourth and fifth control signals ctrl4 and ctrl5, respectively. The chopped signals are transmitted through output terminals 162 and 164 to the first amplifier 360.

The first amplifier 360 differentially amplifies the signals chopped by the chopping circuit part 350.

The filter 370 filters the signals amplified by the first amplifier 360.

The second amplifier 380 finally amplifies the signals filtered by the filter 370.

The finally amplified signals are converted into digital signals by the A/D converter 170 of FIG. 3.

Meanwhile, the pulse controller 110 can control the entire system. Specifically, the pulse controller 110 outputs the first control signal ctrl1 of a high pulse only while A/D converting of the A/D converter 170, and outputs the first control signal ctrl1 of a low pulse after A/D converting of the A/D converter 170 is completed. Accordingly, only while A/D converting of the A/D converter 170, a pulse, that is, a control signal is output from the AND gate 160, so that the first and second current amplifiers 130 and 131 are driven, and a pulse and an inverse pulse are output.

As described with reference to FIGS. 3 and 4, the pulse controller 110 can adjust the waveform of a control signal ctrl1 according to a signal $L_1$ provided from the A/D converter 170. Alternatively, the pulse controller 110 can output a control signal ctrl1 of a low pulse a predetermined time after a detected signal output from the second amplifier 380 reaches its full rising value. The predetermined time is a time previously set by experimentally calculating enough time to finish converting a detected signal into a digital signal by the A/D converter.

Figure 14:
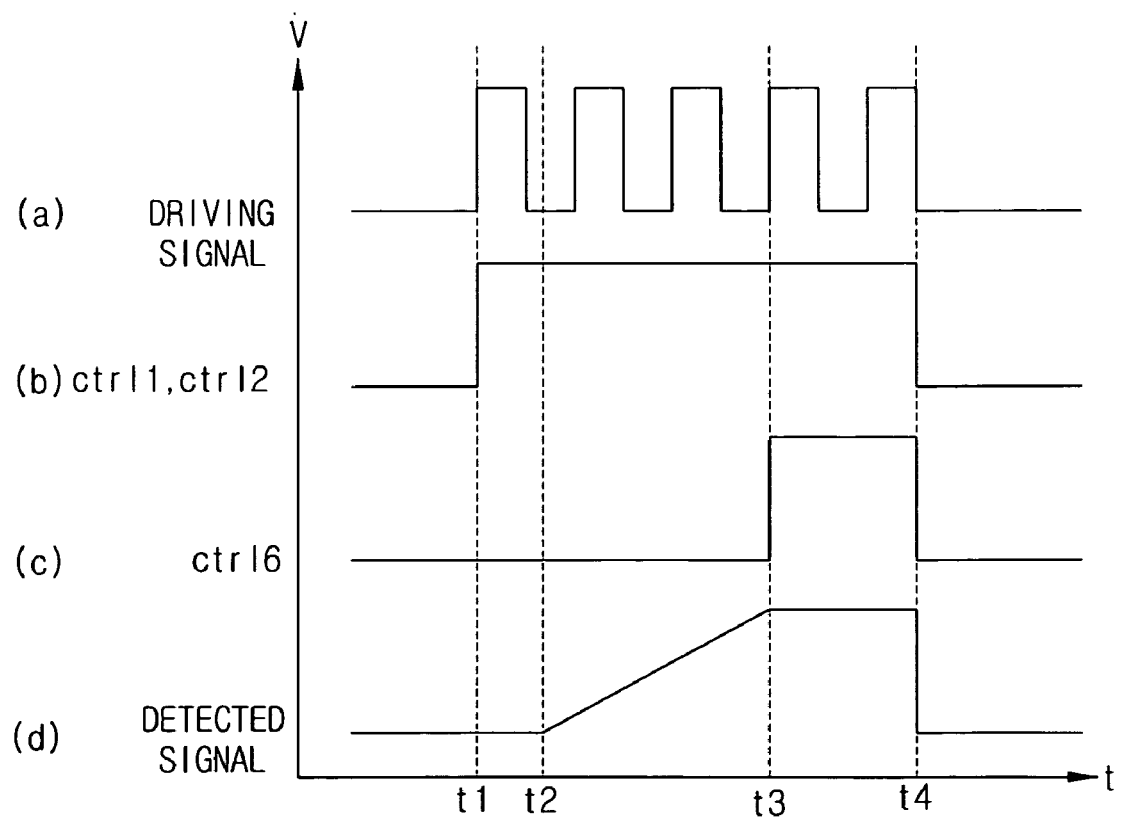
FIG. 14 illustrates waveforms of control signals to control the fluxgate module and detected signals.

FIG. 14 illustrates waveforms of signals used in the sensing apparatus according to an embodiment of the present invention. Referring to FIG. 14, waveform (a) indicates a control signal output from the pulse restricting part 200, i.e., a driving signal to drive the pulse amplifier 310. Waveform (b) indicates the first control signal ctrl1 which is a control pulse output from the pulse controller 110, and the second control signal crtl2 to turn on some transistors in the input switching part 320. The third control signal ctrl3 is not shown in FIG. 14, but the third control signal ctrl3 can be input at the point of time when the second control signal is low level. As a result, X-axis and Y-axis fluxgates are alternately excited.

As the first control signal ctrl1 maintains a high pulse between t1 and t4, the driving signal has an alternating pulse between t1 and t4.

As the second control signal crtl2 has the high pulse form, if the fluxgate 330 is excited as described above, a detected signal corresponding to the terrestrial magnetism is detected from the detecting coils 144 and 148 after predetermined point of time t2 as in waveform (d) of FIG. 14. The detected signal reaches its full rising value at t3. If the detected signal reaches its full rising value at t3, the pulse controller 110 outputs a sixth control signal ctrl6 to the A/D converter 170 in order for the A/D converter 170 to perform A/D converting. The pulse controller 110 adjusts the control signals crtl1 crtl2 to a low pulse after a predetermined time t4−t3 from the point of time reaching its full rising value goes by, so that power consumption can be prevented.

Meanwhile, the output switching part 340 transmits the detected signal to the chopping circuit part 350 according to the second and third signals ctrl2 and ctrl3. The waveform of the signal output from the chopping circuit part 350 is shown as in FIG. 15.

Figure 15:
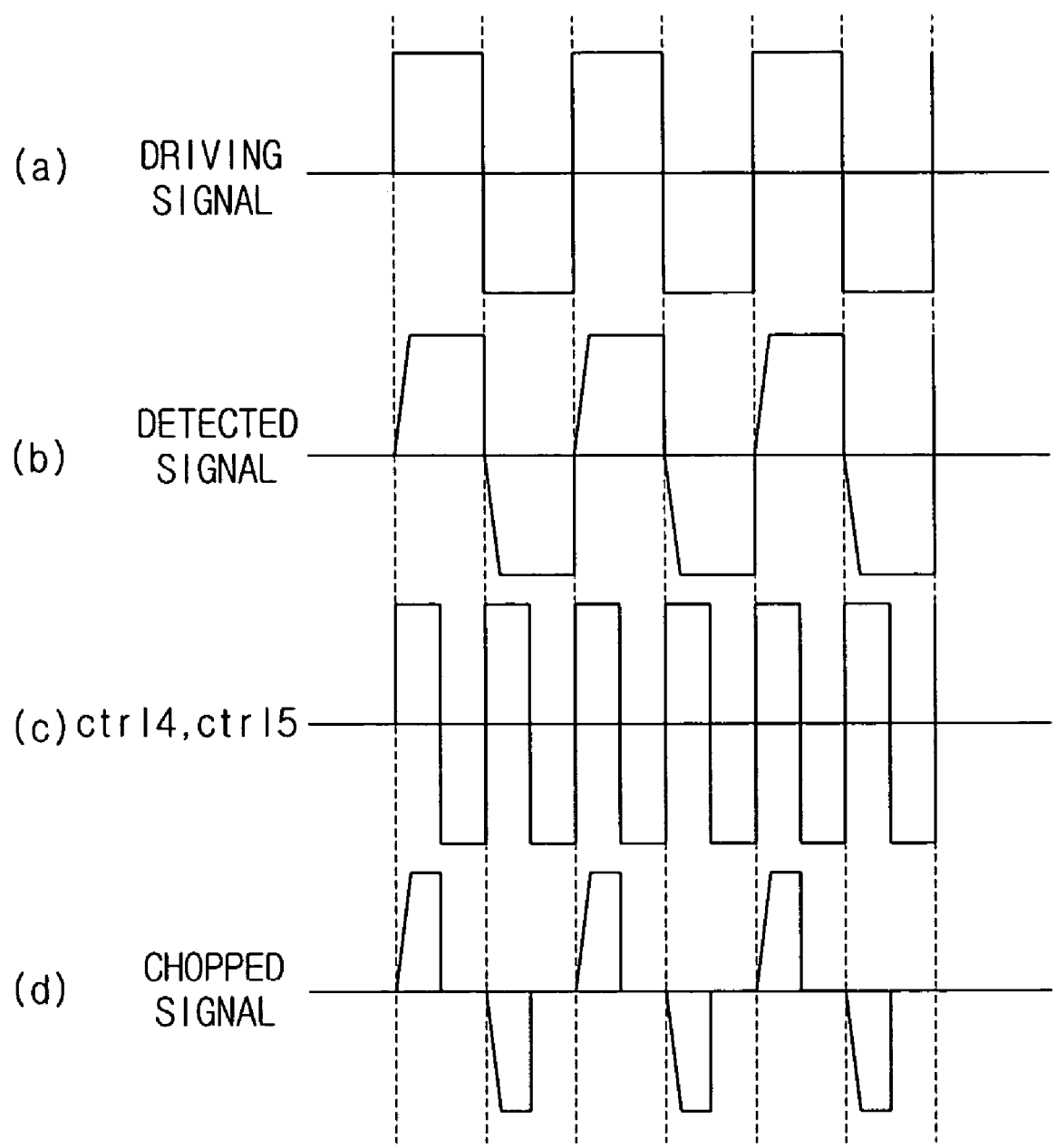
FIG. 15 illustrates waveforms output from the fluxgate module.

If a driving signal is applied as in waveform (a) of FIG. 15 and a detected signal is detected as in waveform (b), fourth and fifth control signals crtl4 and crtl5 are transmitted to the chopping circuit part 350 by the pulse controller 110 or a separately disposed control circuit (not shown). Waveform (c) of FIG. 15 shows an example of the fourth and fifth control signals crtl4 and crtl5. According to waveform (c) of FIG. 15, the chopping control signal can have frequency twice that of the driving pulse.

The chopped signal is signal-processed sequentially by the first amplifier 360, the filter 370 and the second amplifier 380. The analog signal output from the second amplifier 380 can be shown as in waveform (d) of FIG. 15.

With the sensing apparatus having the fluxgate according to the present invention, an amount of current required to drive the fluxgate may be sharply reduced, so that power consumption of the whole sensing apparatus may also be reduced. Furthermore, the sensing apparatus according to the present invention can be manufactured on a wafer using the MEMS technology and is designed to use a signal processing circuit for detected signals of each of 2-axis in common, so that the volume of each element can considerably decrease.

Preferred embodiments of the present invention that have been disclosed herein may be readily applied to realize a 3-axis fluxgate in accordance with the principles set forth herein to those of ordinary skill in the art.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A sensing apparatus having a fluxgate, comprising:
a fluxgate module configured to output an analog signal corresponding to terrestrial magnetism using a fluxgate including a magnetic substance core and a driving coil; and
an analog-to-digital (A/D) converter configured to convert an analog signal output from the fluxgate module into a digital signal,
wherein the fluxgate module includes first and second current amplifiers connected to respective first and second ends of the driving coil, and a pulse restricting part configured to supply an output signal to operate the first and second current amplifiers, wherein the output signal is a driving pulse while the A/D converter is converting the analog signal and is no pulse when the digital signal is output from the A/D converter, wherein the pulse restricting part includes:
a pulse generator configured to generate the driving pulse,
a pulse controller configured to output a control pulse to control the operation of the fluxgate, and
a logic gate configured to logically operate on the driving pulse and the control pulse and to supply the output signal according to the results of the logical operation to the first and second current amplifiers.

2. The sensing apparatus as claimed in claim 1, wherein the pulse controller is configured to output a control pulse of a high value while the A/D converter is converting the analog signal and a control pulse of a low value when the digital signal is output from the A/D, and
the logic gate is configured to logically multiply the driving pulse and the control pulse, and to supply the output signal according to the results of the logical multiplication to the first and second current amplifiers.

3. The sensing apparatus as claimed in claim 1, wherein the fluxgate module further comprises an inverter configured to invert the output signal from the pulse restricting part and to supply an inverted output signal to the second current amplifier, and
the second current amplifier is configured to amplify the inverted output signal and to output an inversion pulse.

4. The sensing apparatus as claimed in claim 3, wherein the fluxgate is a 2-axis fluxgate of which axes cross at right angles.

5. A sensing apparatus having a fluxgate, comprising:
a fluxgate module configured to output an analog signal corresponding to terrestrial magnetism using a fluxgate including a magnetic substance core and a driving coil, the fluxgate being a 2-axis fluxgate of which axes cross at right angles; and an analog-to-digital (A/D) converter configured to convert an analog signal output from the fluxgate module into a digital signal, wherein the fluxgate module includes first and second current amplifiers connected to respective first and second ends of the driving coil, and a pulse restricting part configured to supply an output signal to operate the first and second current amplifiers, wherein the output signal is a driving pulse while the A/D converter is converting the analog signal and is no pulse when the digital signal is output from the A/D converter, wherein the fluxgate module further includes, an inverter configured to invert the output signal from the pulse restricting part and to supply an inverted output signal to the second current amplifier, the second current amplifier is configured to amplify the inverted output signal and to output an inversion pulse, an input switching part configured to selectively transmit the driving pulse and inversion pulse output from the first and second current amplifiers to the driving coils of the 2-axis fluxgate, and an output switching part configured to selectively transmit a detected signal from the 2-axis fluxgate.

6. The sensing apparatus as claimed in claim 5, wherein the fluxgate module further comprises:

a chopping circuit part configured to chop the detected signal transmitted from the output switching part and to output a chopped signal;

a first amplifier configured to amplifier the chopped signal and to output a first amplified chopped signal;

a filter configured to filter the first amplified chopped signal and to output a filtered chopped signal; and a second amplifier configured to amplifier the filtered chopped signal and to output a second amplified chopped signal to the A/D converter.

7. The sensing apparatus as claimed in claim 6, wherein the pulse controller is configured to output another control signal, wherein the another control signal is high when the signal output from the second amplifier is at a peak value and is otherwise low.

8. A method of controlling a sensing apparatus which includes a fluxgate having a magnetic substance core and a driving coil, first and second current amplifiers which excite the magnetic substance core by applying pulses to first and second ends of the driving coil, a fluxgate module including a pulse restricting part which controls the operation of the first and second current amplifiers, and an analog-to-digital (A/D) converter which converts an analog signal output from the fluxgate module into a digital signal, the method comprising:

generating an output signal from the pulse restricting part to operate the first and second current amplifiers; and A/D converting an analog-signal output from the fluxgate module and outputting a digital signal, wherein the output signal is a driving pulse during the A/D converting and is no pulse when the digital signal is output, generating the output signal further including generating the driving pulse, outputting a control pulse to control the operation of the fluxgate, and logically operating on the driving pulse and the control pulse and supplying the output signal according to the results of the logical operation to the first and second current amplifiers.

9. The method as claimed in claim 8, wherein the pulse controller configured to output a control pulse of a high value while the A/D converter is converting the analog signal and a control pulse of a low value when the digital signal is output from the A/D converter, and logically operating includes logically multiplying the driving pulse and the control pulse.

10. The method as claimed in claim 9, further comprising inverting the output signal from the pulse restricting part and supplying an inverted output signal to the second current amplifier, and amplifying the inverted output signal and outputting an inversion pulse from the second current amplifier.

11. The method as claimed in claim 10, wherein the fluxgate is a 2-axis fluxgate of which axes cross at right angles.

12. The method as claimed in claim 11, further comprising:

selectively transmitting the driving pulse and inversion pulse output from the first and second current amplifiers to the driving coils of the 2-axis fluxgate; and selectively transmitting a detected signal from the 2-axis fluxgate.

13. The method as claimed in claim 12, further comprising:

chopping the detected signal and outputting a chopped signal;

amplifying the chopped signal and outputting a first amplified chopped signal;

filtering the first amplified chopped signal and outputting a filtered chopped signal; and amplifying the filtered chopped signal and outputting a second amplified chopped signal to the A/D converter.

14. The method as claimed in claim 13, further comprising outputting another control signal, wherein the another control signal is high when the signal output from the second amplifier is at a peak value and is otherwise low.

* * * * *